(12) United States Patent
Lano et al.

(10) Patent No.: US 6,933,475 B2
(45) Date of Patent: Aug. 23, 2005

(54) METHOD AND SYSTEM FOR TURNING ON AN OPTICAL RADIATION SOURCE

(75) Inventors: Roberto Lano, Almese (IT); Eduardo Augusto Miranda Sologuren, Turin (IT)

(73) Assignee: Agilent Technologies, Inc., Palo Alto, CA (US)

( * ) Notice: Subject to any disclaimer, the term of this patent is extended or adjusted under 35 U.S.C. 154(b) by 145 days.

(21) Appl. No.: 10/388,566

(22) Filed: Mar. 14, 2003

(65) Prior Publication Data

US 2003/0173353 A1 Sep. 18, 2003

(30) Foreign Application Priority Data

Mar. 16, 2002 (EP) .......................................... 02251895

(51) Int. Cl.[7] ................................................ H05B 1/02
(52) U.S. Cl. ....................... 219/494; 219/501; 219/502; 219/497; 219/505; 372/29.02; 372/32; 372/34
(58) Field of Search ................................ 219/494, 501, 219/502, 497, 505; 347/185–199, 212, 234, 237; 372/29.02, 34, 36, 32

(56) References Cited

U.S. PATENT DOCUMENTS

| | | | |
|---|---|---|---|
| 5,406,172 A | 4/1995 | Bennett | 315/112 |
| 5,438,579 A | 8/1995 | Eda et al. | 372/34 |
| 5,663,975 A | 9/1997 | Yoshida et al. | 372/46 |
| 5,825,792 A | 10/1998 | Villeneuve et al. | 372/32 |
| 5,982,789 A * | 11/1999 | Marshall et al. | 372/22 |
| 6,646,665 B2 * | 11/2003 | Goto et al. | 347/187 |

OTHER PUBLICATIONS

Patent Abstracts of Japan Publication No. 05260274.

Patent Abstracts of Japan Publication No. 01166583.

* cited by examiner

Primary Examiner—Mark Paschall

(57) ABSTRACT

An optical communication module includes an optical radiation source as well as control circuitry to control the temperature and the power emitted by he optical source. In order to permit soft start-up of the source while avoiding undesired wavelength variations, the optical source is pre-heated before being caused to emit optical radiation. This may be effected by initially heating the optical source to an initial temperature using the thermoelectrical conditioner associated therewith as a heater and subsequently causing a partly under-threshold current to flow through the source, thus causing the source to be heated while still emitting negligible optical power.

37 Claims, 3 Drawing Sheets

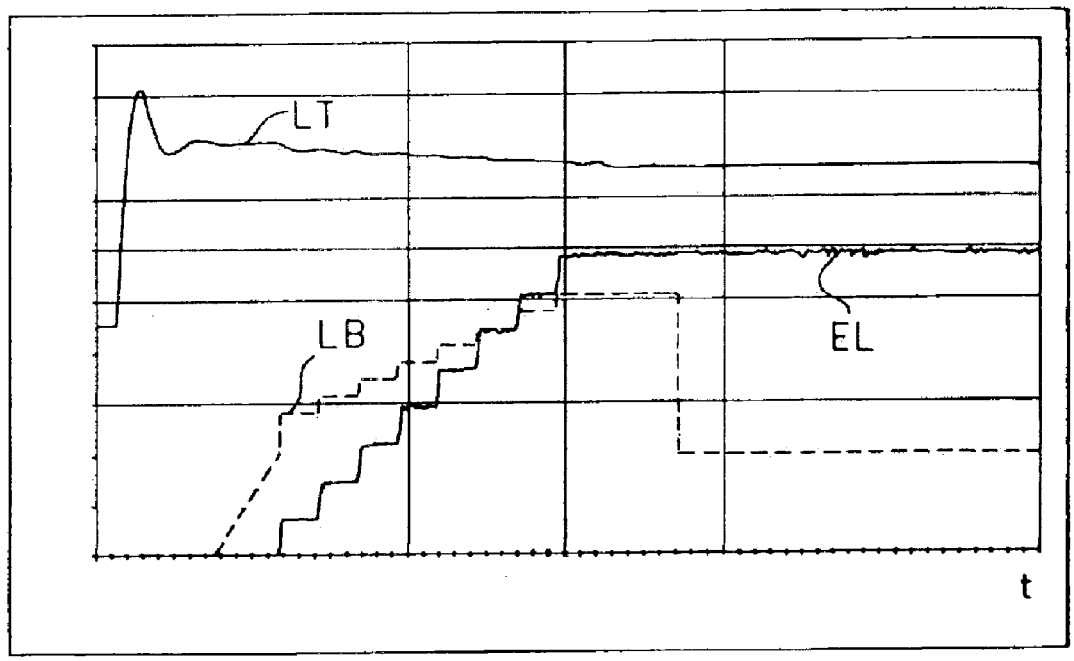
Fig_3

METHOD AND SYSTEM FOR TURNING ON AN OPTICAL RADIATION SOURCE

BACKGROUND OF THE INVENTION

1. Field of the Invention

The present invention relates generally to optical sources and, in particular, to controlling an optical source during start up.

2. Brief Description of Related Developments

Commercial wavelength division multiplex (WDM) systems, especially of the "dense" type (DWDM) provide high transmission capacity operating with channel spacings of 50–100 GHz.

In order to ensure the wavelength stability required for the optical source, real time control of the wavelength emitted is an essential feature to be provided (preferably together with automatic power and extinction ratio control) in any of the transmitter modules included in a WDM/DWDM arrangement.

The modules in question generally include a laser diode as the optical source emitting signal light together with a so-called "wavelength locker" arrangement—including a wavelength selective optical component and photodiodes to detect any wavelength and power variations in the laser source, a laser driver to bias the laser diode and a temperature conditioning element such as a thermoelectric cooler (TEC)—typically a Peltier element—for controlling the temperature of the laser diode together with its drive circuit.

One of the most critical phases of operation of such a module is the start-up phase.

During the start-up phase, the optical source is turned on and, within the first few hundreds microseconds, its temperature may significantly change. The wavelength of the radiation emitted may consequently exceed the maximum allowed fluctuations, while the wavelength and power control systems usually associated with such a module (and intended essentially to ensure source stability during normal operation) may operate with different time constants during the start-up phase thus undesirably contributing to such fluctuations.

In fact wavelength stability of the optical source must be ensured also under these conditions, in order to avoid that undesired large fluctuations in the output wavelength of the radiation emitted by the module being turned-on may adversely affect performance in the adjacent channels.

Prior art arrangements providing for optical wavelength and/or power control using analogue techniques, such as disclosed e.g. in U.S. Pat. No. 5,825,792 are not in a position to properly ensure such a strict wavelength control during the start-up phase. The same also applies to arrangements as disclosed e.g. in U.S. Pat. No. 5,438,579 providing for fairly sophisticated wavelength stabilization against temperature-related variations.

Certain DWDM modules are also known in the art including optical switches or controlled attenuators to prevent light emission when the laser diode is turned on, so that the laser beam is emitted only after the undesired wavelength variations are dispensed with. The main drawback of these arrangements lies in that additional elements (the optical switch or controlled attenuator) must be included in the module. Also, these additional devices may undesirably interfere with laser emission during normal operation.

SUMMARY OF THE INVENTION

The object of the present invention is thus to provide an optical wavelength and power control system wherein the drawbacks of the prioir are dispensed with and the final operation wavelength may be safely reached without exceeding the maximum allowed fluctuations.

According to the present invention, such an object is achieved by means of a method having the features called for in the claims which follow. The invention also relates to the corresponding system.

The method of the invention is particularly, yet not exclusively, adapted for use in a wavelength and power control system for an optical communication module including: a laser diode as the optical source; photosensitive elements such as photodiodes, at least one of which has associated therewith a wavelength selective optical component such an optical filter, to detect any wavelength/power variations in the laser diode; a laser driver to bias the laser diode and a temperature conditioning element, such as a thermoelectric cooler (TEC) based on the Peltier effect, for controlling the temperature of the laser diode with a corresponding drive circuit associated therewith.

In the case of an optical source comprised of a laser diode, as a first step, the diode junction is subject to preheating.

Such pre-heating preferably involves forcing a current through the laser diode, so that the laser diode is subject to self-heating by the current flowing through it. The intensity of this current is zero at the beginning and is subsequently increased until a minimum current value (IBias) is reached.

However, before forcing the current flow, the laser diode is brought to an initial temperature (TInitial) which is a function of the laser current (IBias), the final laser temperature (TWorking point) and a theoretical estimation of the working point laser current. This first preheating is preferably effected by using the TEC controller.

The optical power is then a gradually increased to reach the final optical power value. This process is started once of the minimum current (IBias) is reached and involves increasing the optical power starting from the value reached at the end of the previous phase (Pinitial) to reach the final optical power value (PWorking point) intended for regular operation.

Once the final optical power value (PWorking point) is reached and the temperature control target is updated to the final temperature value (TWorking point) the wavelength sensor is adapted to the give valid wavelength measurements, thus enabling the wavelength controller to reach the final wavelength target value (WWorking point). The wavelength controller is enabled while the temperature control is disabled and the temperature sensor is subsequently used as a temperature monitor only.

During normal operation, ageing phenomena affect the laser diode that are compensated to maintain the operating point (optical power and wavelength) unchanged by automatically adjusting e.g. the thermoelectric cooler (TEC) temperature and the laser currents.

In the presently preferred embodiment, the solution of the invention further ensures that when the module is turned off and then turned on again, the new start-up sequence points to the right power and wavelength targets by taking into account the ageing effects. This ageing tracking procedure provides for the average values of the TEC temperature and laser current to be stored daily. In that way, if the module is turned off and then turned on again, the start-up sequence uses the updated values thus stored in order to reach the actual ageing-compensated operating points.

BRIEF DESCRIPTION OF THE DRAWINGS

The invention will now be described, by way of example only, with reference to the annexed drawings, wherein:

FIG. 3 shows the typical time behaviours of the laser temperature, laser bias current and optical power in an optical module operated according to the invention.

DETAILED DESCRIPTION OF THE PREFERRED EMBODIMENT(S)

Figure 1:
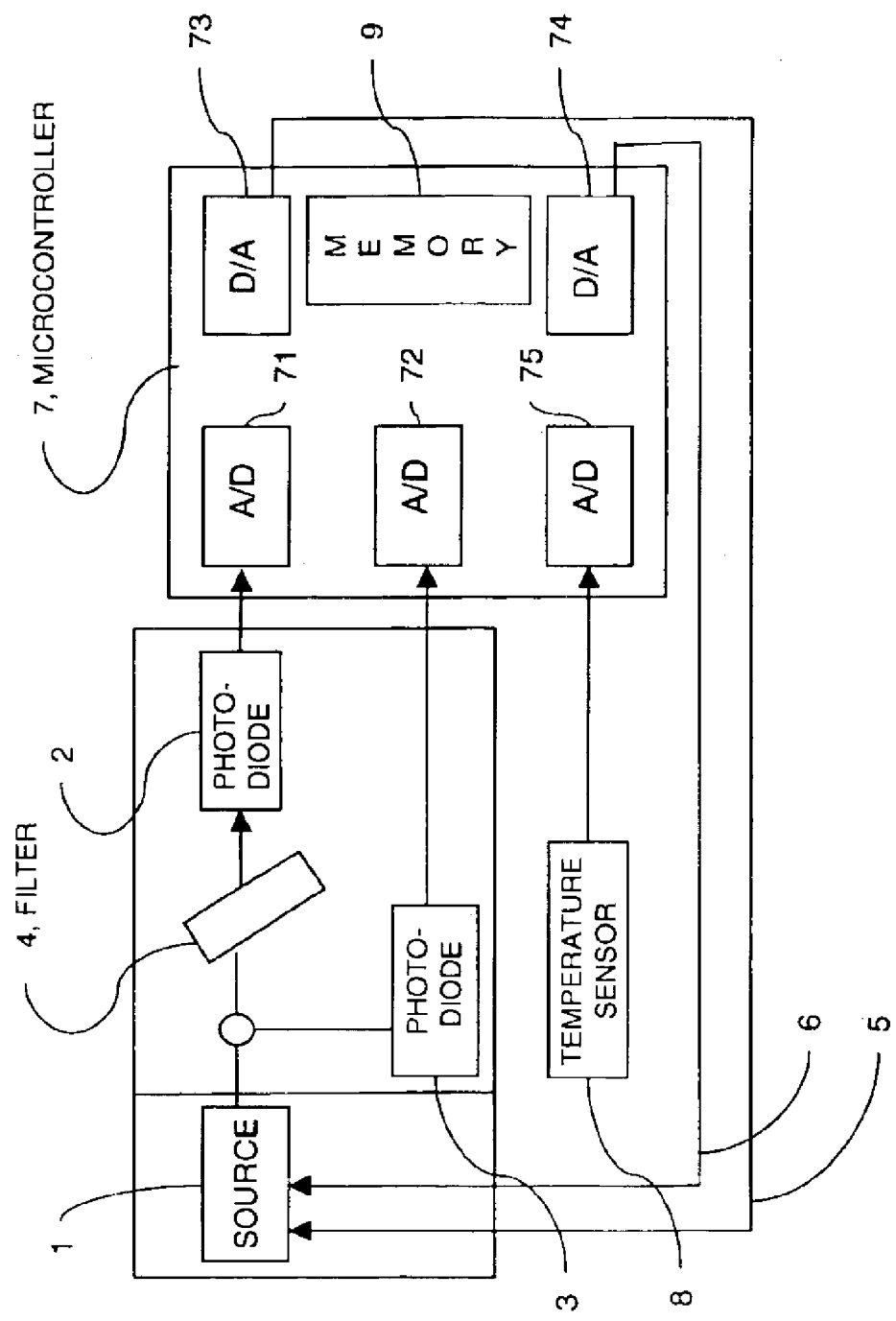
FIG. 1 is a block diagram of an optical module adapted to be operated according to the invention.

The arrangement shown in FIG. 1 essentially includes an optical source such as a laser beam source 1 mounted on a so-called Optical Sub-Assembly (OSA) together with first and second photosensitive elements 2 and 3 usually comprised of photodetectors such as photodiodes.

First photodiode 2 has associated therewith a wavelength-selective element 4. Element 4 may be comprised of an optical filter centred at a wavelength corresponding to the nominal emission wavelength of laser source 1.

The arrangement in question, currently referred to as a "wavelength locker" provides for photodiode 3, used as reference, to sample an unfiltered portion of the laser beam. Another portion of the laser beam is passed through optical filter 4 and caused to impinge onto photodiode 2.

The response (i.e. the photocurrent) of photodiode 2 is thus a function of the possible displacement/misalignment of the actual wavelength of the beam generated by laser source 1 with respect to its nominal wavelength.

Conversely, the response of photodiode 3 is indicative of the power emitted by laser source 1.

The arrangement in question is conventional in the art and does not require to be described in greater detail herein.

This also applies to the provision of elements or means permitting the wavelength and power of the radiation emitted by source 1 to be selectively controlled.

These currently include a thermoelectric cooler (TEC) such as a Peltier element (not shown) associated to laser source 1 and controlled via a line 5, thus permitting the laser temperature to be controlled and temperature-induced wavelength variations compensated.

Similarly, reference 6 designates a line adapted to convey a control signal of the laser source currents to enable selective control of the power emitted by source 1.

In the exemplary embodiment of the invention shown, the required control action of optical source 1 via the signals on lines 5 and 6 is effected as a function of the output signals of photodiodes 2 and 3 is effected by means of a micro-controller generally designated 7.

Being essentially a digital device, micro-controller 7 includes one or more analogue-to-digital converters 71, 72 to convert into the digital format the output signals of photodiodes 2 and 3 as well as one or more digital-to-analogue converters 73, 74 to convert the digital output signal of micro-controller 7 into analogue signals adapted to be conveyed on lines 5 and 6.

The embodiment of the invention shown herein also includes a temperature sensor 8 sensitive to the external "ambience" temperature with respect to laser source 1 (and the respective Optical Sub-Assembly or OSA).

A further analogue-to-digital-converter 75 is thus included in micro-controller 7 to convert the output signal of temperature sensor 8 to the digital format.

Essentially, DWDM transmitters including modules of the kind just described must ensure that the emitted light is always within valid wavelength limits. If the wavelength of the radiation emitted exceeds such limits, both the transmitted data are lost and also the adjacent DWDM channels are adversely affected.

For instance, in current DWDM systems, the emitted wavelength must be within ±30 GHz and ±6 GHz with respect to the nominal wavelength value during start-up and during normal operation, respectively.

The most significant source of wavelength variations are variations in the laser diode temperature. In fact, the wavelength of the radiation emitted is a function of the laser diode temperature. This physical phenomenon explains why DWDM modules use controlled thermoelectric coolers (TECs) such as Peltier elements to maintain the laser diode temperature as constant as possible.

When a laser diode is turned on, by causing an appreciable current flow through it, the diode junction temperature changes during the first microseconds due to the additional power to be dissipated. Even if temperature control is used, the temperature may still change leading to large wavelength variations, e.g. in excess of 30 GHz.

Essentially, the arrangement disclosed herein implements a sort of "soft" start-up procedure in order to limit the initial undesired wavelength variations in the optical radiation emitted by the laser source. In that way, the optical module is allowed to reach a predefined working point while avoiding the undesired initial wavelength variations currently encountered when the laser source is turned on.

When the module is turned on, the soft start-up procedure is executed in order to reach precise values for the optical power, wavelength and extinction ratio (i.e. the predefined working point) of the laser source, while taking into account the fact that the emitted wavelength must always remain within predefine limits.

In the presently preferred embodiment of the invention, the soft start-up procedure is performed within microcontroller 7 as a result of interaction of a finite state machine (FSM) and four control functions, namely i) temperature control, ii) power control, iii) wavelength control and iv) extinction ratio control.

A detailed description of these control functions is provided in a co-pending European patent application filed concurrently with this application.

The finite state machine generates commands to the various actuators/controllers (see lines 5 and 6 of FIG. 1) assigning to them different targets to be reached as a function of real-time measurements and theoretical estimations of the actual wavelength value. Once the working point is reached, the soft start-up procedure is terminated and each control function is then operated under steady conditions with the aim of maintaining the working point of laser source 1 unchanged.

As explained in the foregoing, when laser source 1 is turned on, initial wavelength variations are generated due to the diode junctions being almost instantaneously heated. This physical phenomenon cannot be compensated by standard temperature control functions i.e. because junction heating takes place within the laser diode, whereby any temperature sensor associated to laser source is not able to properly sense and measure such heating immediately.

The solution disclosed herein provides for the diode junction to be subject to pre-heating as a result of two combined effects, namely i) initial heating to a first temperature Tinitial using the TEC as a heater (which is permitted by the reversibility of the Peltier effect), and ii)

subsequent heating obtained by causing an under-threshold current to flow through the diode, thus causing the laser junction to be heated while still emitting negligible optical power.

In the embodiment shown herein, laser preheating is thus effected by a combined action of two effects.

Firstly, laser diode 1 is heated using the TEC controller; subsequently, the laser junction is further heated forcing an under-threshold current to flow trough the laser diode.

The laser junction is located inside the laser diode and the wavelength of the radiation emitted depends on the junction temperature and not on the laser diode surface temperature.

The TEC temperature control brings the laser diode (the surface of laser diode) to a predefined temperature.

Consequently, this first heating action by itself may not be enough to ensure the required control of wavelength variations because when the laser is turned on a current will flow through it to generate further heating and the ensuing wavelength variations.

The laser junction is thus further heated by an under-threshold current so that, as a result of this further heating action, the laser junction is brought to a temperature that is equal to the laser diode external temperature plus the contribution of heating the junction.

As a result of the combined heating action described in the foregoing, laser diode 1 can be turned on (that is an over-threshold current can be caused to flow through laser diode 1) with a limited variation of the wavelength value.

The sequence of actions for laser preheating is thus the following.

The laser diode is brought to an initial temperature (Tinitial). This process is not instantaneous, so that a certain amount of time must be caused to lapse before the further heating action is started.

Such further heating action involves an under-threshold current being forced to pass through the laser diode.

This under-threshold current is preferably a "ramp" that begins with at zero current value (0 mA) and is increased until a predefined value (Ibias).

Ibias is generally an over-threshold current, but several values before reaching it (Ix<Ibias) are under-threshold and allow heating the laser junction. When the ramp reaches the final value (Ibias) the laser is automatically turned on (Ibias>threshold current) and the laser generates a valid wavelength value.

To ensure this, the initial temperature Tinitial must be chosen in such a way that the laser diode generates the right wavelength value when it is turned on with a current Ibias. Thus Tinitial is a function of Ibias, the final temperature TWorking point and a theoretical estimation of the working point laser current.

At this point, the laser is turned on and generates a very low optical power (Pinitial).

Before reaching this point the Pinitial values is not known, so, when this point is reached, the Pinitial is measured and is gradually increased until reach its final value (Pfinal).

For each intermediate value of optical power, microcontroller 7 calculates a proper value of temperature, which is passed to the TEC temperature control in order to bring the laser diode to the calculated temperature.

Each temperature value is calculated in order to minimize the wavelength variation respect to the nominal value.

Figure 2:
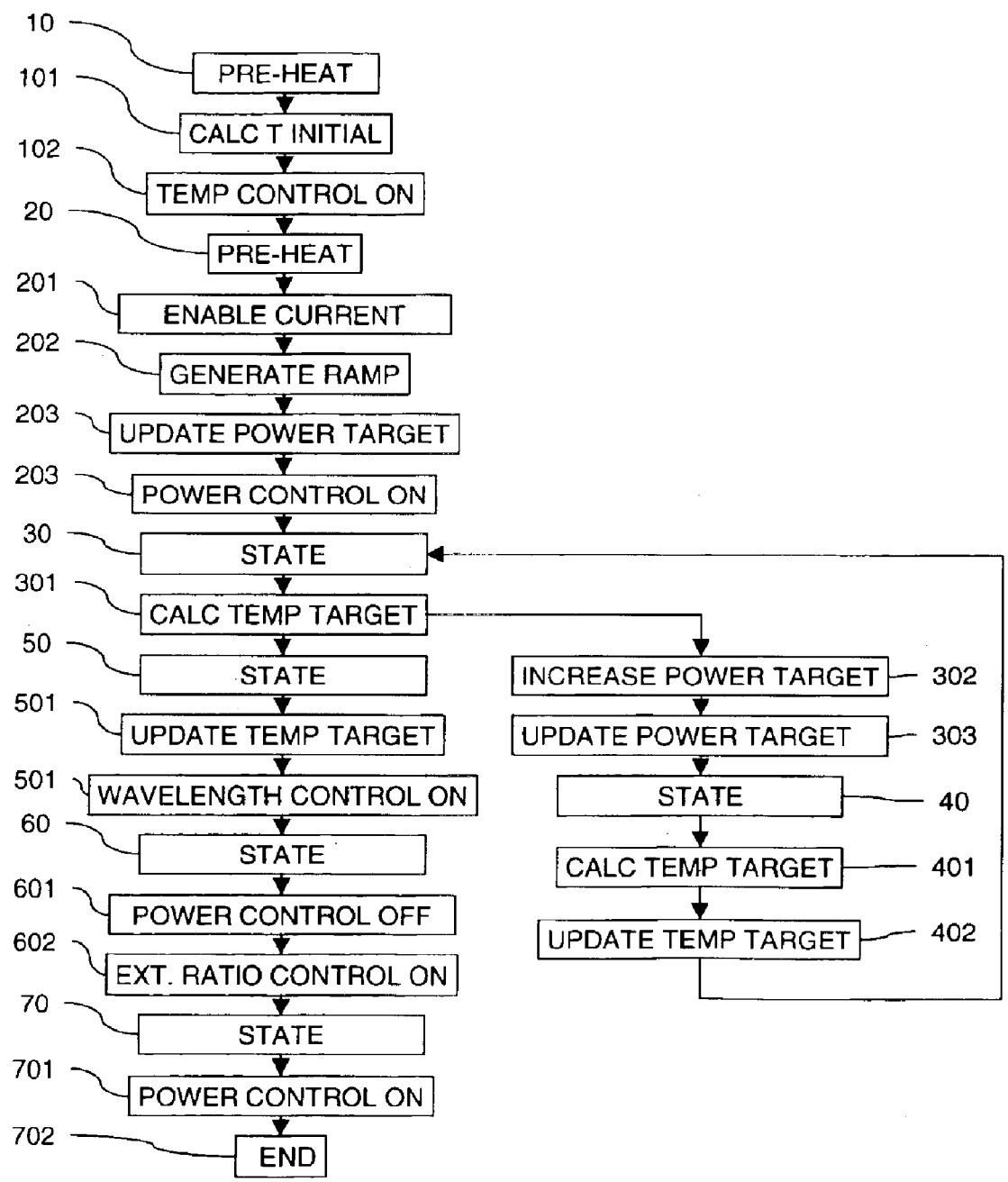
FIG. 2 is a flow diagram showing the start-up procedure of the invention.

By referring to the flow diagram of FIG. 2, the soft start-up procedure referred to in the foregoing may be regarded as comprised of five basic phases, namely:

pre-heating the laser diode junction,
gradually increasing the optical power generated until the final optical power value reached,
reaching the final wavelength value,
reaching the final extinction ratio value, and
reaching the final working point.

The process in question is adapted to be effected by microcontroller 7 by implementing a finite state machine (FSM) whose operation is based on seven states essentially corresponding to blocks 10 to 70 in the block diagram of FIG. 2.

States 10 and 20 correspond to the laser diode junction pre-heating phase. At the beginning of this phase, the finite state machine calculates in a step 101 the initial target temperature (TInitial)—and then turns on the temperature control function—step 102—thus causing a current ramp to be generated and caused to flow through laser diode 1.

The current through laser source 1 is initially zero and then increases until a pre-defined minimum current value IBias is reached. Such initial current value(s) are under-threshold so that laser source 1 only emits very low optical power.

In the flow-diagram of FIG. 2, the steps corresponding to the laser diode current being enabled and a ramp-shaped laser diode current being generated are designated 201 and 202, respectively.

Once the current IBias is reached, the power emitted by laser source 1 is measured (as a function of the signal generated by photodiode 3), and the corresponding power target is updated (in step 203) in order to cause the optical power generated by source 1 to grow gradually starting from the optical power level PInitial reached at the end of the previous phase.

The power control function is turned on in a step 204 and caused to track subsequent increasing power targets in order to generate a step-wise, staircase-like increase in the power emitted. For each increase step the finite state machine calculates a new temperature target in order to minimise wavelength variations.

The foregoing essentially corresponds to states 30 and 40 in the flow diagram of FIG. 2 where step 301 is the initial step of a routine that is repeated periodically. Such a routine includes the steps of increasing the power target by a calculated differential value (step 302) and updating the power target (step 303). Such a routine also includes a state 40 to calculate the temperature target in order to minimise wavelength errors (step 401) and updating the temperature target (step 402).

As a result of completing the last increase step the module reaches the final optical power value (PWorking point), while the temperature control target is updated to the final temperature value TWorking point.

At this point the wavelength sensor is able to give valid wavelength measurements and a state 50 is reached in the finite state machine to update the wavelength target value (step 501) and turning on the wavelength control function (step 502) by assigning to it the final wavelength target value WWorking point.

In order to enable the wavelength control function, the temperature controller function is disabled and during the subsequent phases the temperature sensor is used as a temperature monitor only.

Upon reaching a subsequent state 60, the power control function is turned off (step 601) while the extinction ratio control function is turned on (step 602).

For that purpose, the modulation current Imod of laser diode 1 is generated (in a manner known per se) allowing data transmission. During this phase the power control function is disabled for a short period of time (as indicated in step 601) in order to allow the laser driver electronics to supply the new bias and modulation currents IBias and IMod, respectively.

After this short intermission, the finite state machine evolves to a state 70 where the power control function is turned on again (step 701). Thereafter, the system evolves to final step 702 which marks the end of the start-up procedure.

At this point both the power and wavelength control functions are enabled and the module has reached the predefined working point. Also, the extinction ratio control function is enabled and the module is ready to transmit data.

During current operation of the module, at least one of the operating parameters corresponding to the working point of laser source 1 is stored in a memory associated with microcontroller 7, such as memory 9. The data in question are stored in terms of average data over a certain time basis (e.g. in the form of average values which are updated daily).

Such periodically updated information records the effect of ageing phenomena of laser diode 1, thereby making it possible for the module to use such ageing-compensated data during subsequent start-up phases possibly effected in case the module is turned off to be subsequently turned on.

Further details concerning both the extinction ratio control function and recording of ageing-compensated data in memory 9 are provided in the co-pending application already referred to in the foregoing.

In FIG. 3, diagrams designated LT, LB and EL show the typical behaviour over time (abscissa scale) of laser temperature LT, laser bias current LB and optical power EL emitted by laser 1 during the soft start-up procedure described in the foregoing.

By referring also to FIG. 2, in the exemplary embodiment considered in FIG. 3, state 10 lasts about 8 seconds after the beginning (0 seconds) of the start-up procedure. State 20 reached thereafter is terminated about 12 seconds after the beginning of the start-up procedure. States 30 and 40 are activated about 12 seconds and terminated about 32 seconds after the beginning of the start-up procedure. State 50 is reached about 32 seconds from the beginning of the start up procedure to be left at about 38 seconds to reach state 60. State 60 is terminated at about 39 seconds, when state 70 (steady state) is reached.

Of course, the principle of the invention remaining the same, the details of construction and the embodiments may widely vary with respect to what has been described and illustrated purely by way of example, without departing from the scope of the present invention as defined by the annexed claims. Also, it will be appreciated that terms such as "optical", "light", "photosensitive", and the like are used herein with the meaning currently allotted to those terms in fiber and integrated optics, being thus intended to apply to radiation including in addition to visible light e.g. also infrared and ultraviolet radiation. Finally, even though the invention was devised by paying specific attention to the possible use in connection with laser diodes, the optical source considered may not necessarily be a laser diode, the solution of the invention being adapted to be used also in association with other sources such as different types of laser sources.

What is claimed is:

1. A method for turning on an optical radiation source, said optical source having associated therewith control circuitry to control the temperature of said optical source, the method comprising:

pre-heating said optical source before said optical source is caused to emit optical radiation by heating said optical source to an initial temperature using heater and subsequently heating said optical source by causing a current to flow through said optical source, wherein said initial temperature is a function of at least one parameter selected from the group consisting of a minimum current value, a temperature to be reached by said optical source during operation, and an estimation of the intensity of the current flowing through said optical source in emitting said radiation during operation;

the method including controlling the temperature of said optical source during said pre-heating as a function of a target temperature, wherein optical radiation is emitted as a result of current flowing through said optical source above a threshold value, and wherein said optical source has associated therewith control circuitry to control the current flowing through said optical source, and wherein pre-heating said optical source includes causing current to flow through said optical source with an intensity at least partly below said threshold value, whereby said optical source is pre-heated while still emitting negligible optical power.

2. A method for turning on an optical radiation source, said optical source having associated therewith control circuitry to control the temperature of said optical source, the method comprising:

pre-heating said optical source before said optical source is caused to emit optical radiation by heating said optical source to an initial temperature using a heater and subsequently heating said optical source by causing a current to flow through said optical source, wherein said initial temperature is a function of at least one parameter selected from the group consisting of a minimum current value, a temperature to be reached by said optical source during operation, and an estimation of the intensity of the, current flowing through said optical source in emitting said radiation during operation;

controlling the temperature of said optical source during said pre-heating as a function of a target temperature, wherein optical radiation is emitted as a result of current flowing through said optical source;

the method including increasing the intensity of said current during the pre-heating of said optical source up to a predefined minimum current value.

3. A method for turning on an optical radiation source, said optical source having associated therewith control circuitry to control the temperature of said optical source, the method comprising:

pre-heating said optical source before said optical source is caused to emit optical radiation by heating said optical source to an initial temperature using a heater and subsequently heating said optical source by causing a current to flow through said optical source, wherein said initial temperature is a function of at least one parameter selected from the group consisting of a minimum current value, a temperature to be reached by said optical source during operation, and an estimation of the intensity of the current flowing through said optical source in emitting said radiation during operation;

controlling the temperature of said optical source during said pre-heating as a function of a target temperature, wherein optical radiation is emitted as a result of current flowing through said optical source, increasing the power of said optical radiation generated by said optical source up to a final optical power value;

increasing the temperature of said optical radiation source up to a final temperature value; and associating with said optical source a wavelength control function to control the wavelength of said optical radiation generated by said optical source after said final optical power and temperature values are reached.

4. The method of claim 3, wherein said initial temperature is selected as said target temperature.

5. The method of claim 3, further comprising selecting a laser diode as said optical source.

6. The method of claim 3, further comprising associating with said optical source at least one temperature conditioning element for controlling the temperature of said optical source.

7. The method of claim 6, further comprising using said temperature conditioning element as said heater for heating said optical source to said, initial temperature.

8. The method of claim 3, further comprising associating with said optical source at least one current driver to selectively control the intensity of current flowing, through said optical source.

9. A method for turning on an optical radiation source, said optical source having associated therewith control circuitry to control the temperature of said optical source, the method comprising:

pre-heating said optical source before said optical source is caused to emit optical radiation by heating said optical source to an initial temperature using a heater and subsequently heating said optical source by causing a current to flow through said optical source, wherein said initial temperature is a function of at least one parameter selected from the group consisting of a minimum current value, a temperature to be reached by said optical source during operation, and an estimation of the intensity of the current flowing through said optical source in emitting said radiation during operation;

controlling the temperature of said optical source during said pre-heating as a function of a tar et temperature, wherein optical radiation is emitted as a result of current flowing through said optical source;

the method including gradually increasing the power of the optical radiation generated by said optical source after said predefined minimum current value is reached.

10. The method of claim 9, wherein said increase in the power of the optical radiation generated by said optical source is effected in a step-wise manner.

11. The method of claim 10, further comprising controlling the temperature of said optical source by means of said control circuitry by assigning a new temperature target for each step in said step-wise increase of the power of said optical radiation generated by said optical source.

12. A method for turning on an optical radiation source, said optical source having associated therewith control circuitry to control the temperature of said optical source, the method comprising:

pre-heating said optical source before said optical source is caused to emit optical radiation;

increasing the power of said optical radiation generated by said optical source up to a final optical power value;

increasing the temperature of said optical radiation source up to a final temperature value; and associating with said optical source a wavelength control function to control the wave length of said optical radiation generated by said optical source after said final optical power and temperature values are reached.

13. The method of claim 12, further comprising assigning to said wavelength control function a final wavelength target value for the wavelength of the optical radiation generated by said optical source.

14. The method of claim 12, further comprising disabling said temperature control circuitry when said wavelength control function is enabled.

15. A method for turning an optical radiation source, said optical source having associated therewith control circuitry to control the temperature of said optical source, the method comprising:

pre-heating said optical source before said optical source is caused to emit optical radiation;

generating a modulation current to modulate said optical source to produce data transmission via said optical radiation, so that said optical source has an extinction ratio defined as the ratio of the power of said optical radiation when said optical radiation source is modulated to produce 1 and 0 logical values, respectively;

controlling said extinction ratio; and at least temporarily discontinuing control of the power generated by said optical radiation source to permit control of said extinction ratio.

16. A method for turning on an optical radiation source, said optical source having associated therewith control circuitry to control the temperature of said optical source, the method comprising:

pre-heating said optical source before said optical source is caused to emit optical radiation;

storing the value of at least one operating parameter of said optical radiation source during operation;

implementing said method for turning on said optical radiation source as a function of said at least one value stored;

increasing the power of said optical radiation generated by said optical source up to a final optical power value;

increasing the temperature of said optical radiation source up to a final temperature value; and associating with said optical source a wavelength control function to control the wavelength of said optical radiation generated by said optical source after said final optical power and temperature values are reached.

17. A method for turning on an optical radiation source, said optical source having associated therewith control circuitry to control the temperature of said optical source, the method comprising:

pre-heating said optical source before said optical source is caused to emit optical radiation;

storing the value of at least one operating parameter of said optical radiation source during operation;

implementing said method for turning on said optical radiation source as a function of said at least one value stored; and updating said at least one value stored in order to compensate for ageing phenomena affecting said optical radiation source.

18. A method for turning on an optical radiation source, said optical source having associated therewith control circuitry to control the temperature of said optical source, the method comprising:

pre-heating said optical source before said optical source is caused to emit optical radiation;

storing the value of at least one operating parameter of said optical radiation source during operation; and implementing said method for turning on said optical radiation source as a function of said at least one value stored, wherein said optical source emits said optical radiation as a result of current flowing through said optical source above a threshold value and in that said control circuitry is arranged to pre-heat said optical source by causing current to flow through said optical source with an intensity at least partly below said threshold value, whereby said optical source is pre-heated while still emitting negligible optical power.

19. A method for turning on an optical radiation source, said optical source having associated therewith control circuitry to control the temperature of said optical source, the method, comprising:

pre-heating said optical source before said optical source is caused to emit optical radiation;

storing the value of at least one operating parameter of said optical, radiation source during operation; and implementing said method for turning on said optical radiation source as a function of said at least one value stored, wherein said control circuitry is arranged to increase the intensity of said current during the pre-heating of said optical source up to a predefined minimum current value.

20. A system comprising:

an optical radiation source; and control circuitry to control the temperature of said optical source, wherein said circuitry includes heating means for pre-heating said optical source before said optical source is caused to emit optical radiation, wherein said optical source emits said optical radiation as a result of current flowing through said optical source, wherein said control circuitry is arranged to pre-heat said optical source by:

heating said optical source to an initial temperature using a heater; and subsequently heating said optical source by causing a current to flow through said optical source, wherein said control circuitry is arranged to control the temperature of said optical source during said pre-heating as a function of a target temperature, wherein said control circuitry is arranged to:

increase the power of said optical radiation generated by said optical source up to a final optical power value;

increase the temperature of said optical radiation source up to a final temperature value;

perform a wavelength control function of said optical source to control the wavelength of said optical radiation generated by said optical source after said final optical power and temperature values are reached; and disable temperature control when said wavelength control function is enabled.

21. The system of claim 20, wherein said control circuitry is arranged to bring said optical radiation source during said pre-heating to a said initial temperature which is a function of at least one parameter selected from the group consisting of a minimum current value, a temperature to be reached by said optical source during operation, and an estimation of the intensity of the current flowing through said optical source in emitting said radiation during operation.

22. The system of claim 20, wherein said initial temperature is selected as said target.

23. A method for turning on an optical radiation source, said optical source having associated therewith control circuitry to control the temperature of said optical source, the method comprising:

pre-heating said optical source before said optical source is caused to emit optical radiation;

storing the value of at least one operating parameter of said optical radiation source during operation; and implementing said method for turning on said optical radiation source as a function of said at least one value stored, wherein said control circuitry is arranged to increase the intensity of said current during the pre-heating of said optical source up to a predefined minimum current value, and wherein said control circuitry is arranged to gradually increase the power of the optical radiation generated by said optical source after said predefined minimum current value is reached.

24. The system of claim 23, wherein said control circuitry is arranged to increase the power of the optical radiation generated by said optical source in a step-wise manner.

25. The system of claim 24, wherein said control circuitry is arranged to control the temperature of said optical source by assigning a new temperature target for each step in said step-wise increase of the power of said optical radiation generated by said optical source.

26. A system comprising:

an optical radiation source; and control circuitry to control the temperature of said optical source, wherein said circuitry includes heating means for pre-heating said optical source before said optical source is caused to emit optical radiation, wherein said control circuitry is arranged to:

increase the power of said optical radiation generated by said optical source up to a final optical power value;

increase the temperature of said optical radiation source up to a final temperature value;

perform a wavelength control function of said optical source to control the wavelength of said optical radiation generated by said optical source after said final optical power and temperature values are reached; and disable temperature control when said wavelength control function is enabled.

27. The system of claim 26, wherein said control circuitry is arranged to assign to said wavelength control function a final wavelength target value for the wavelength of the optical radiation generated by said optical source.

28. A system comprising:

an optical radiation source; and control circuitry to control the temperature of said optical source, wherein said circuitry includes heating means for pre-heating said optical source before said optical source is caused to emit optical radiation, wherein said control circuitry is arranged to:

generate a modulation current to modulate said optical source to produce data transmission via said optical radiation, so that said optical source has an extinction ratio defined as the ratio of the power of said optical radiation when said optical radiation source is modulated to produce 1 and 0 logical values, respectively;

control said extinction ratio; and at least temporarily discontinue control of the power generated by said optical radiation source to permit control of said extinction ratio.

29. A system comprising:

an optical radiation source;

control circuitry to control the temperature of said optical source, wherein said circuitry includes heating means for pre-heating said optical source before said optical source is caused to emit optical radiation; and wherein said control circuitry is arranged to:
increase the power of said optical radiation generated by said optical source up to a final optical power value;
increase the temperature of said optical radiation source up to a final temperature value;
perform a wavelength control function of said optical source to control the wavelength of said optical radiation generated by said optical source after said final optical power and temperature values are reached; and
disable temperature control when said wavelength control function is enabled;

the system including a memory for storing the value of at least one operating parameter of said optical radiation source during operation, wherein said control circuitry is arranged to turn on said optical radiation source as a function of said at least one value stored in said memory.

30. The system of claim 29, wherein said optical radiation source comprises a laser diode.

31. The system of claim 29, further comprising at least one of:
a temperature conditioning element for controlling the temperature of said optical source; and
a current driver to selectively control the intensity of current flowing through said optical source.

32. The system of claim 31, wherein said temperature conditioning element is used as the heater for heating said optical source to said initial temperature.

33. A system comprising:

an optical radiation source;

control circuitry to control the temperature of said optical source, wherein said circuitry includes heating means for pre-heating said optical source before said optical source is caused to emit optical radiation; and a memory for storing the value of at least one operating parameter of said optical radiation source during operation, wherein said control circuitry is arranged to turn on said optical radiation source as a function of said at least one value stored in said memory, wherein said control circuitry is arranged to update said at least one value stored in said memory in order to compensate for ageing phenomena affecting said optical radiation source.

34. A method for turning on an optical radiation source, said optical source having associated therewith control circuitry to control the temperature of said optical source, the method comprising:

pre-heating said optical source before said optical source is caused to emit optical radiation by heating said optical source to an initial temperature using a heater and subsequently heating said optical source by causing a current to flow through said optical source, wherein said initial temperature is a function of at least one parameter selected from the group consisting of a minimum current value, a temperature to be reached by said optical source during operation, and an estimation of the intensity of the current flowing through said optical source in emitting said radiation during operation, controlling the temperature of said optical source during said pre-heating as a function of a target temperature, wherein optical radiation is emitted as a result of current flowing through said optical source, generating a modulation current to modulate said optical source to produce data transmission via said optical radiation, so that said optical source has an extinction ratio defined as the ratio of the power of said optical radiation when said optical radiation source is modulated to produce 1 and 0 logical values, respectively;

controlling said extinction ratio; and at least temporarily discontinuing control of the power generated by said optical radiation source to permit control of said extinction ratio.

35. A method for turning on an optical radiation source, said optical source having associated therewith control circuitry to control the temperature of said optical source, the method comprising:

pre-heating said optical source before said optical source is caused to emit optical radiation;

storing the value of at least one operating parameter of said optical radiation source during operation;

implementing said method for turning on said optical radiation source as a function of said at least one value stored;

generating a modulation current to modulate said optical source to produce data transmission via said optical radiation, so that said optical source has a extinction ratio defined as the ratio of the power of said optical radiation when said optical radiation source is modulated to produce 1 and 0 logical values, respectively controlling said extinction ratio; and at least temporarily discontinuing control of the power generated by said optical radiation source to permit control of said extinction ratio.

36. A system comprising:

an optical radiation source; and control circuitry to control the temperature of said optical source, wherein said circuitry includes heating means for pre-heating said optical source before said optical source is caused to emit optical radiation, wherein said optical source emits said optical radiation as a result of current flowing through said optical source, wherein said control circuitry is arranged to pre-heat said optical source by:
heating said optical source to an initial temperature using a heater; and
subsequently heating said optical source by causing a current to flow through said optical source, wherein said control circuitry is arranged to control the temperature of said optical source during said pre-heating as a function of a target temperature, wherein said control circuitry is further arranged to:
generate a modulation current to modulate said optical source to produce data transmission via said optical radiation, so that said optical source has an extinction ratio defined as the ratio of the power of said optical radiation when said optical radiation source is modulated to produce 1 and 0 logical values, respectively;

control said extinction ratio; and
at least temporarily discontinue control of the power generated by said optical radiation source to permit control of said extinction ratio.

37. A system comprising:

an optical radiation source;

control circuitry to control the temperature of said optical source, wherein said circuitry includes heating means for pre-heating said optical source before said optical source is caused to emit optical radiation, wherein said control circuitry is further arranged to:
generate a modulation current to modulate said optical source to produce data transmission via said optical radiation, so that said optical source has an extinction ratio defined as the ratio of the power of said optical radiation when said optical radiation source is modulated to produce 1 and 0 logical values, respectively;

control said extinction ratio; and at least temporarily discontinue control of the power generated by said optical radiation source to permit control of said extinction ratio;

the system including a memory for storing the value of at least one operating parameter of said optical radiation source during operation, wherein said control circuitry is arranged to turn on said optical radiation source as a function of said at least one value stored in s id memory.

* * * * *